(12) United States Patent
Dadvand

(10) Patent No.: US 10,840,185 B2
(45) Date of Patent: Nov. 17, 2020

(54) SEMICONDUCTOR DEVICE WITH VIAS HAVING A ZINC-SECOND METAL-COPPER COMPOSITE LAYER

(71) Applicant: Texas Instruments Incorporated, Dallas, TX (US)

(72) Inventor: Nazila Dadvand, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/292,878

(22) Filed: Mar. 5, 2019

(65) Prior Publication Data
US 2020/0286837 A1 Sep. 10, 2020

(51) Int. Cl.
| H01L 23/34 | (2006.01) |
|---|---|
| H01L 21/4763 | (2006.01) |
| H01L 21/44 | (2006.01) |
| H01L 23/532 | (2006.01) |
| H01L 23/522 | (2006.01) |
| H01L 21/768 | (2006.01) |

(52) U.S. Cl.
CPC .. *H01L 23/53238* (2013.01); *H01L 21/76802* (2013.01); *H01L 21/76847* (2013.01); *H01L 21/76883* (2013.01); *H01L 23/5226* (2013.01); *H01L 2924/01028* (2013.01)

(58) Field of Classification Search
CPC ............... H01L 23/53; H01L 21/76802; H01L 21/76847; H01L 21/76883; H01L 23/5226; H01L 2924/01028
See application file for complete search history.

(56) References Cited

U.S. PATENT DOCUMENTS

| 6,693,356 B2* | 2/2004 | Jiang ................. H01L 21/76831 257/751 |
| 7,932,579 B2* | 4/2011 | Nagai ............... H01L 21/32136 257/532 |
| 9,466,727 B1* | 10/2016 | Hsu .................... H01L 29/78696 |
| 9,960,135 B2 | 5/2018 | Rinck et al. |
| 2008/0111239 A1 | 5/2008 | Yang et al. |
| 2015/0349014 A1* | 12/2015 | Kobayashi ........ H01L 27/14632 257/444 |
| 2016/0005776 A1* | 1/2016 | Shimotsusa ............. H01L 31/09 250/208.1 |

FOREIGN PATENT DOCUMENTS

| EP | 1610376 | 12/2005 |
| FR | 2979751 | 8/2013 |

* cited by examiner

*Primary Examiner* — Alonzo Chambliss
(74) *Attorney, Agent, or Firm* — Ronald O. Neerings; Charles A. Brill; Frank D. Cimino

(57) ABSTRACT

An integrated circuit (IC) includes a substrate with a semiconductor surface layer including circuitry configured for realizing at least one circuit function including a plurality of transistors, including at least one dielectric layer having a first and a second through-via over the plurality of transistors. The through-vias include a first top level via and at least a second top level via lateral to the first top level via. A composite layer includes copper (Cu), a first metal including zinc, and a second metal, wherein the composite layer is on a barrier layer that is on the first top level via and on the second top level via. A plurality of Cu traces includes a first Cu top metal trace on the composite layer contacting the first top level via and a second Cu metal trace on the composite layer contacting the second top level via.

20 Claims, 5 Drawing Sheets

SEMICONDUCTOR DEVICE WITH VIAS HAVING A ZINC-SECOND METAL-COPPER COMPOSITE LAYER

FIELD

This Disclosure relates to the field of semiconductor devices, and more particularly to vias for semiconductor devices.

BACKGROUND

In integrated circuit (IC) design and processing a via is a relatively small opening in a dielectric layer (e.g., silicon oxide layer) that allows an electrically conductive connection to be provided in between different stacked electrically conductive layers including between adjacent metal layers. A via connecting the lowest layer of a stack of metal layers to a dopant diffusion or to a polysilicon layer is generally specifically called a "contact". One via level is between the top metal layer and the uppermost metal interconnect layer thereunder. The top metal layer provides the bond pads and generally includes some metal traces used for some routing, such as to provide a redistribution layer (RDL) arrangement.

The top level metal generally comprises either aluminum or copper. Copper (Cu) provides higher speed and better electromigration resistance as compared to aluminum. In the case of Cu top metal, chemical-mechanical planarization (CMP) is needed for removal because as known in the art Cu cannot be removed by depositing a layer of Cu, forming a pattern such as with photoresist (PR), and then etching away the unwanted parts of the Cu layer using reactive gases, such as used commonly used for etching an aluminum layer.

SUMMARY

This Summary is provided to introduce a brief selection of disclosed concepts in a simplified form that are further described below in the Detailed Description including the drawings provided. This Summary is not intended to limit the claimed subject matter's scope.

This Disclosure recognizes the required overlap (e.g. 5.5 μm) of a Cu or a Cu alloy top metal layer over the topmost level vias (top level vias) can limit the number of top level vias under Cu traces that are conventionally formed on a Cu seed layer, which can limit the current carrying capability. A large needed overlap of the Cu traces over the top level vias results in fewer (in the case of a fixed via area) or a smaller area of top level vias being possible, which results in less current carrying capability. It is also recognized herein the need for a large overlap for the top Cu traces over the top level vias results from two main causes. Etching a conventional Cu seed layer also etches the Cu traces thereon which reduces the width of the Cu trace (e.g., a 20 μm wide line might become a 19 μm line, thus being a 5% width reduction). In addition the Cu seed layer generally being a sputtered layer etches more quickly than the Cu top metal layer generally being an electroplated layer causing an undercut in the Cu seed layer.

Disclosed aspects solve the above-described seed layer undercut problem under Cu top metal by forming a first metal comprising zinc (Zn) seed layer instead of a conventional Cu seed layer, that is on a refractory metal barrier layer. Another metal layer referred to herein as a second metal layer is then formed on the first metal comprising Zn seed layer, that with a Cu trace thereon upon a suitable heating forms a Zn-second metal-Cu composite layer at the interfaces between the Cu traces and the barrier layer.

Disclosed aspects also solve the problem where commercially available acid Cu plating solutions dissolve some seed layers, such as a disclosed first metal comprising Zn seed layer. Also conventional commercially available alkaline Cu plating solutions damage PR. Therefore, the plating of Cu on a first metal comprising Zn seed layer disclosed herein would not be considered feasible by those having ordinary skill in the art.

Disclosed aspects include an IC comprising a substrate with a semiconductor surface layer including circuitry configured for realizing at least one circuit function comprising a plurality of transistors, including at least one dielectric layer having a first and a second through-via over the plurality of transistors. The through-vias include a first top level via and at least a second top level via lateral to the first top level via. A composite layer functioning as a via interface includes Cu, a first metal including Zn, and a second metal, wherein the composite layer is on a barrier layer that is on the first top level via and on the second top level via. A first Cu top metal trace is on the composite layer contacting over the first top level via and a second Cu top metal trace is on the composite layer contacting the second top level via.

Disclosed aspects include a method including forming composite layers on top level vias comprising forming a relatively thin layer of a second metal (e.g., Ni, Co, Fe, Cr) that can be electroplated from a chloride-free neutral or near neutral pH second metal plating bath on a first metal layer comprising Zn seed layer that avoids removal of the seed layer. After plating the Cu top metal layer, a heating follows to inter-diffuse the first metal comprising Zn, the second metal, and the Cu resulting in the formation of a Zn-second metal-Cu composite layer at the interface between Cu traces and the barrier layer which is over the top level vias. Since the Zn-second metal-Cu composite layer is resistant against commonly used chemicals for the etching of the first metal comprising Zn seed layer which generally comprise a wet etch, when etching the first metal comprising Zn seed layer and then etching the barrier layer, the problem of seed layer undercut under the Cu top metal traces is reduced or eliminated.

BRIEF DESCRIPTION OF THE DRAWINGS

Reference will now be made to the accompanying drawings, which are not necessarily drawn to scale, wherein.

DETAILED DESCRIPTION

Figure 1:
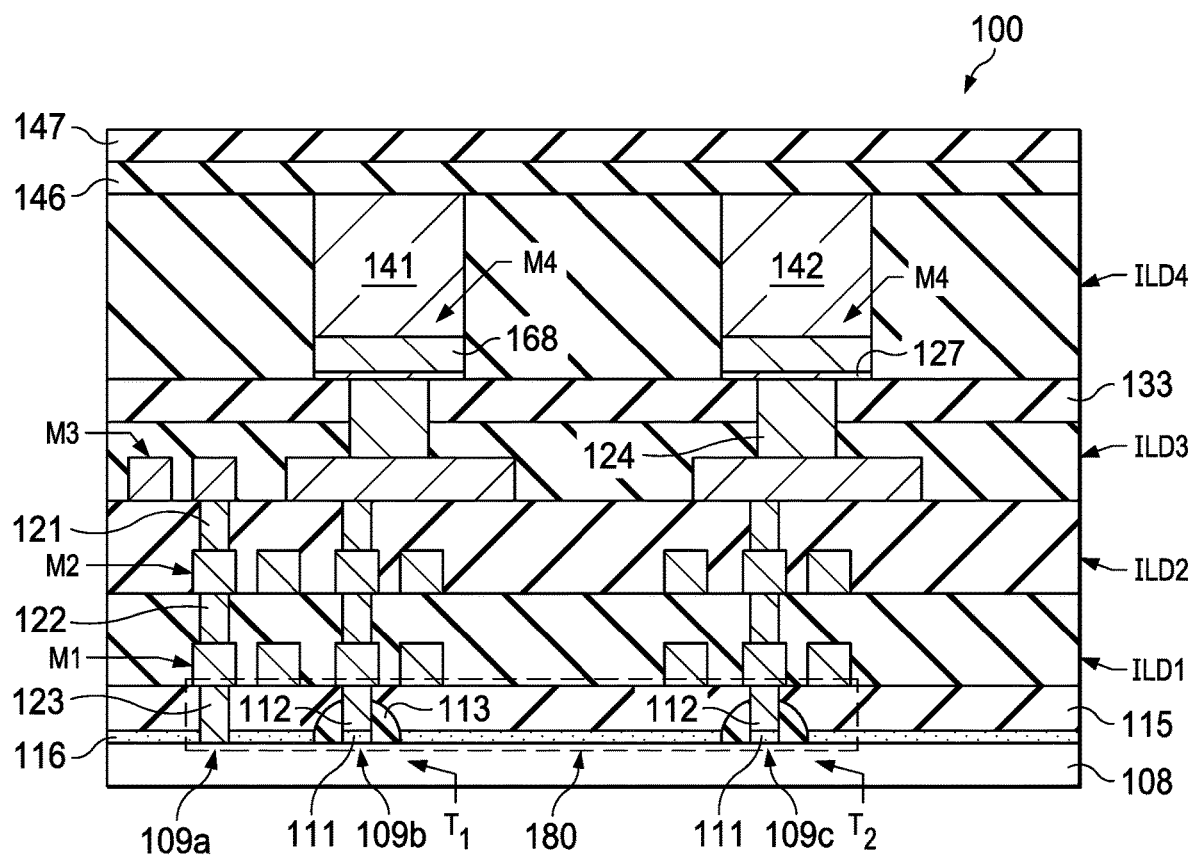
FIG. 1 is a cross sectional view of an example IC device including topmost level vias having a Zn-second metal-Cu composite layer at the interface between top level Cu traces and the barrier layer over top level vias, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1 is a cross sectional view of an example IC device 100 including top-level vias having a disclosed Zn-second metal-Cu composite layer 168 at the interface between Cu traces 141, 142 and a barrier layer 127 that is over top level vias 124, according to an example aspect. IC device 100 includes a metal stack shown by example including three (3) layers of metal interconnect shown as metal 1 (M1), M2 and M3 that are shown damascened into inter-level dielectric layer 1 (ILD1), ILD2, and ILD3, respectively, on a dielectric layer over the top semiconductor surface that may be referred to as a pre-metal dielectric (PMD) 115 which may be on another dielectric layer shown as 116, such as a thermally grown silicon oxide layer. A top level metal level comprising Cu shown as M4 includes Cu traces shown as 141 and 142 which can function as an a RDL, and also provides a plurality of bond pads. A dielectric layer shown as 133 is on ILD3 that provides an etch stop, such as comprising silicon nitride.

Vias 121 are shown coupling M3 to M2, vias 122 coupling M2 to M1, and vias 123 coupling M1 to the semiconductor surface of the substrate 108. Circuitry 180 is shown in a small portion that includes node 109a shown as a diffusion (e.g., n+ or p+) to semiconductor surface of the substrate 108, node 109b which is the gate 112 of a MOS transistor shown as $T_1$, and a node 109c which is the gate 112 of MOS transistor shown as $T_2$. The circuitry 180 comprises circuit elements (including transistors such as $T_1$ and $T_2$), and generally also includes diodes, resistors, capacitors, etc.) formed in the semiconductor surface layer of the substrate 108 configured together for realizing at least one circuit function such as analog (e.g., an amplifier, power converter or power field effect transistor (FET)), radio frequency (RF), digital, or a memory function.

Vias 121 to 123 couple M3 lines to a node 109a, and vias 121 to 124 (with top level via 124 on top) couple the Cu trace 141 to node 109b which is as noted above the gate 112 of $T_1$ that is on a gate dielectric 111 on the semiconductor surface of a substrate 108, such as a silicon comprising surface in one aspect, where the gates are shown having sidewall spacers 113. Cu trace 142 is shown coupled to node 109c which as noted above is the gate 112 of $T_2$ that is on a gate dielectric 111 on the semiconductor surface of the substrate 108. Sources, drains and wells that are generally also present are not shown for simplicity. The vias 121, 122, 123 and 124 can all comprise tungsten, or another suitable electrically conductive plug material.

M4 as noted above comprises Cu, such as pure Cu or a Cu alloy that is shown surrounded by a dielectric layer shown as ILD4, where M4 is on a disclosed Zn-second metal-Cu composite layer 168 that is on a refractory metal barrier layer 127 that is on the top level vias 124. The barrier layer 127 may comprise TiW, Ta, TaN, Ti or TiN. The Cu traces 141 and 142 are shown coupled by the top level vias 124 through the dielectric layer 133 and ILD3 to M3, and from M3 all the way to features on the semiconductor surface of the substrate 108, such as from the Cu trace 141 to node 109b and from the Cu trace 142 to node 109c.

IC device 100 generally includes at least one dielectric passivation layer(s) over the Cu traces 141 and 142, with the passivation layers shown in FIG. 3 being a first passivation layer 147 (e.g., silicon nitride or silicon oxynitride) on a second passivation layer 146 (e.g., silicon oxide or silicon oxynitride). Although not shown, there can be an etch stop layer (e.g., silicon nitride) under the second passivation layer 146.

Figure 2:
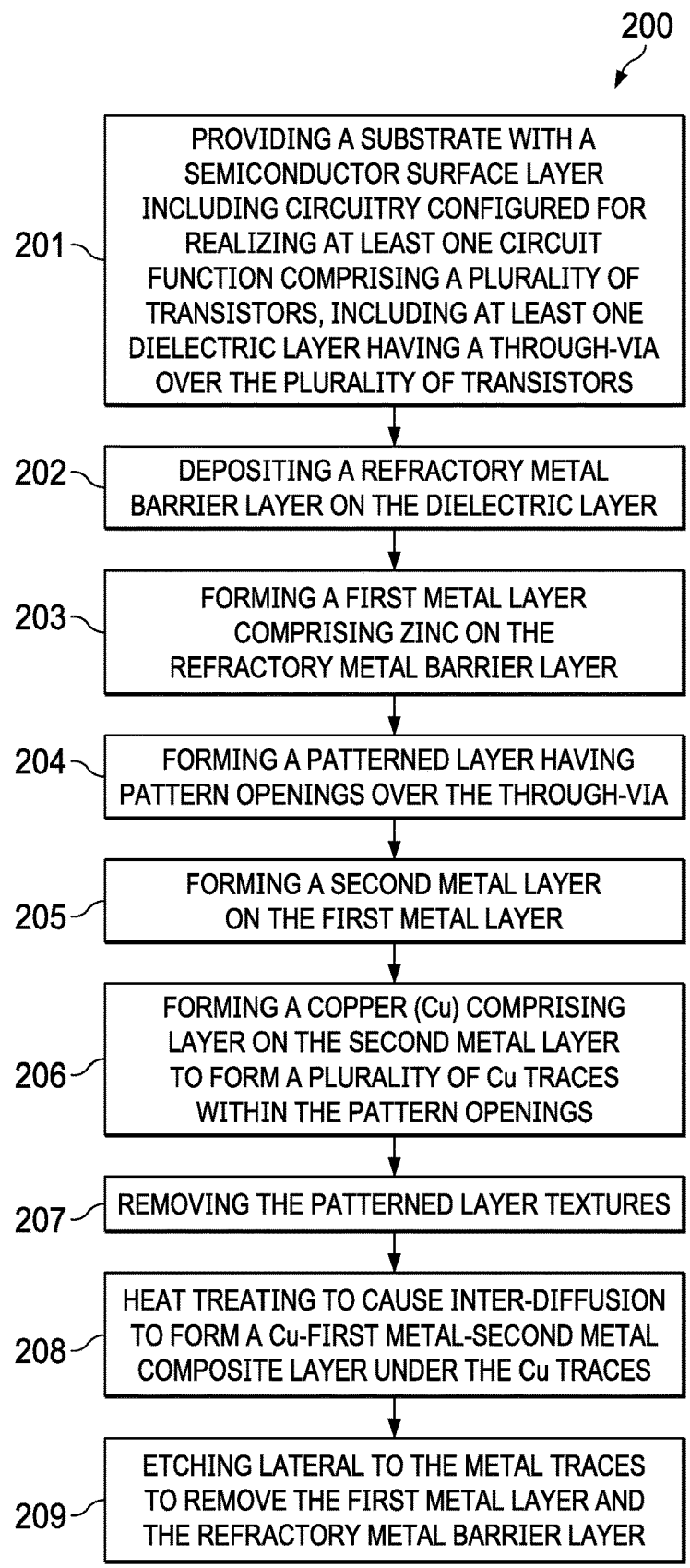
FIG. 2 is a flow chart that shows steps in an example method for forming a disclosed composite layer over a barrier layer over top level vias, the composite layer having a Zn-second metal-Cu composite layer at the interface between Cu traces and the barrier layer, according to an example aspect.

FIG. 2 is a flow chart that shows steps in an example method 200 for forming a disclosed composite layer on top-level vias having a Zn second metal-Cu composite layer on a barrier layer, where the composite layer provides an interface between Cu traces and the barrier layer, according to an example aspect. Step 201 comprises providing a substrate with a semiconductor surface layer including circuitry configured for realizing at least one circuit function comprising a plurality of transistors, including at least one dielectric layer having a through-via over the plurality of transistors. Step 202 comprises depositing a refractory metal barrier layer on the dielectric layer. Step 203 comprises forming (e.g., sputtering) a first metal layer comprising Zn on the refractory metal barrier layer.

Figure 3A:
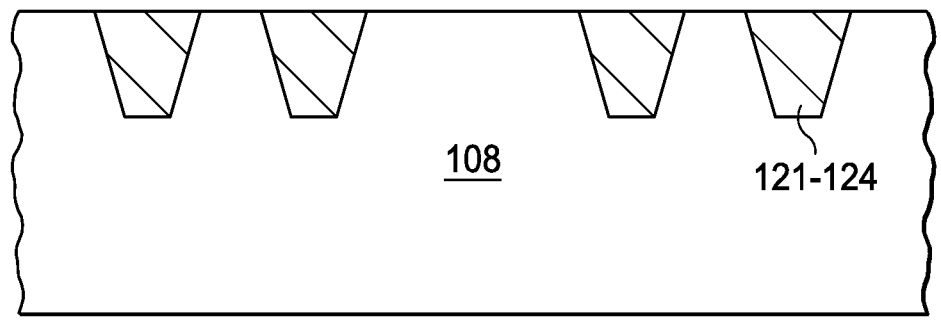
FIGS. 3A-F show cross section depictions of an in-process IC having a Zn-second metal-Cu composite layer at the interface between Cu traces and the barrier layer over top level vias corresponding to steps in the method shown in FIG. 2, according to an example aspect.
Figure 3B:
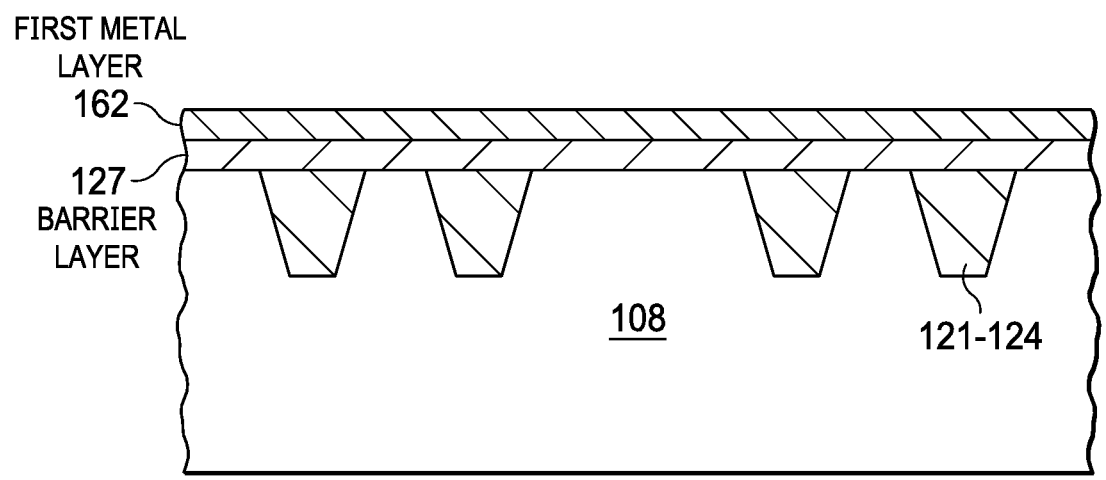
Figure 3C:
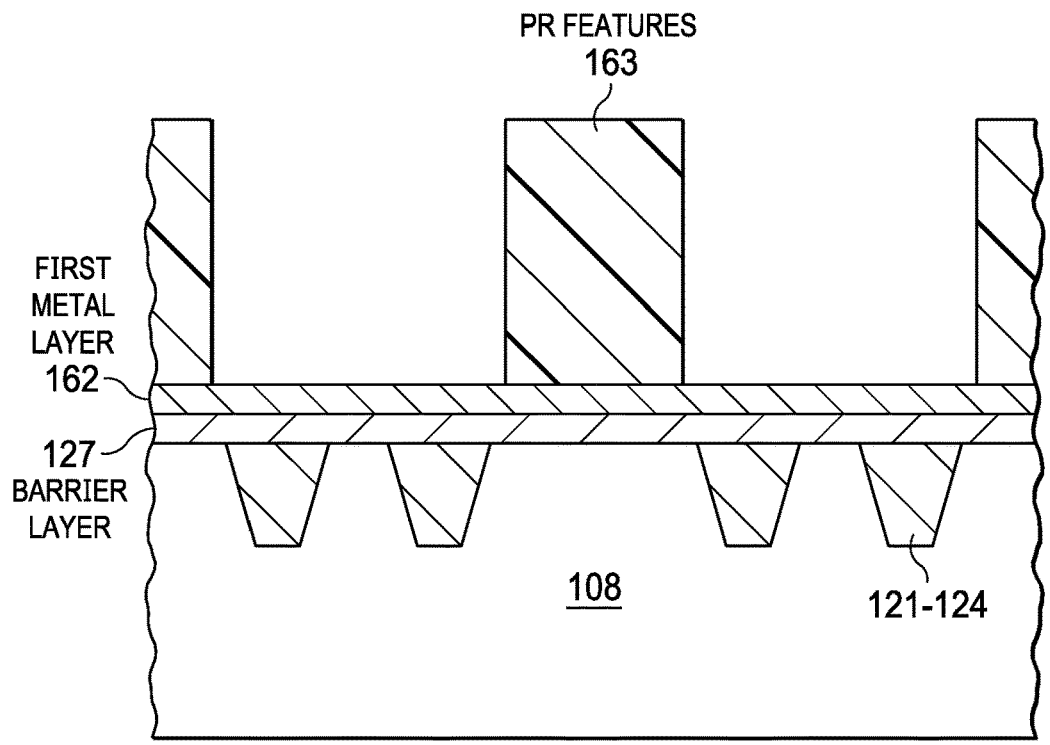
Figure 3D:
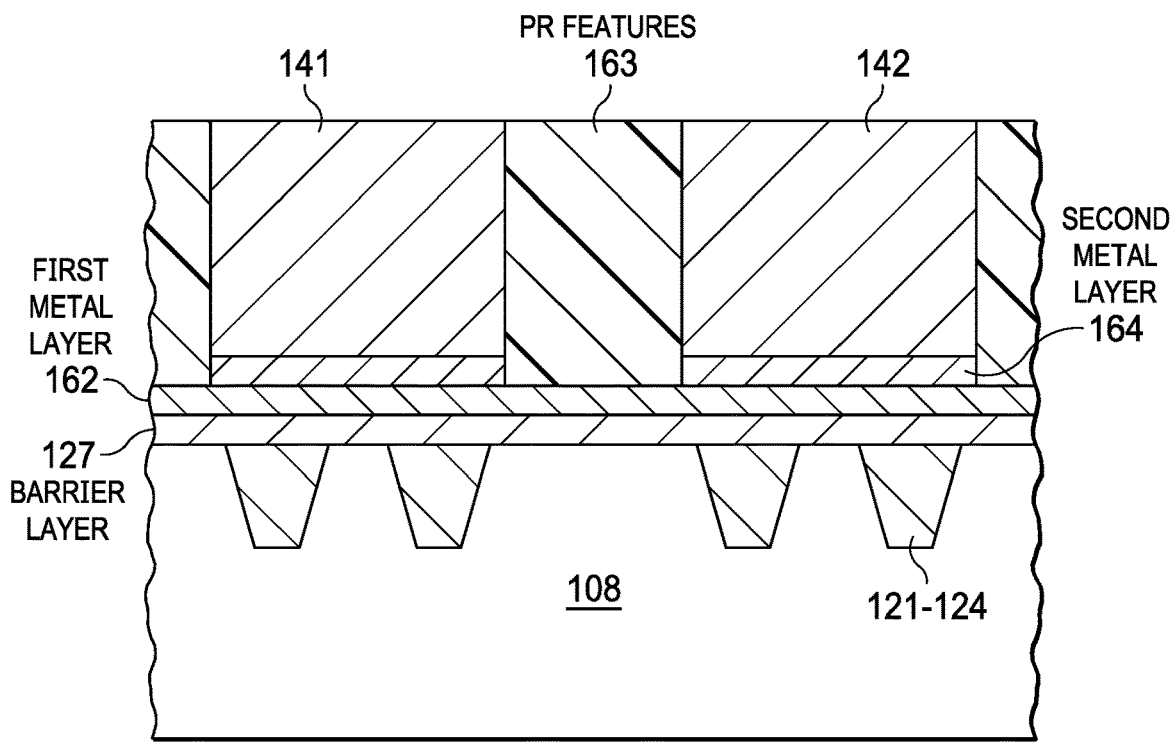
Figure 3E:
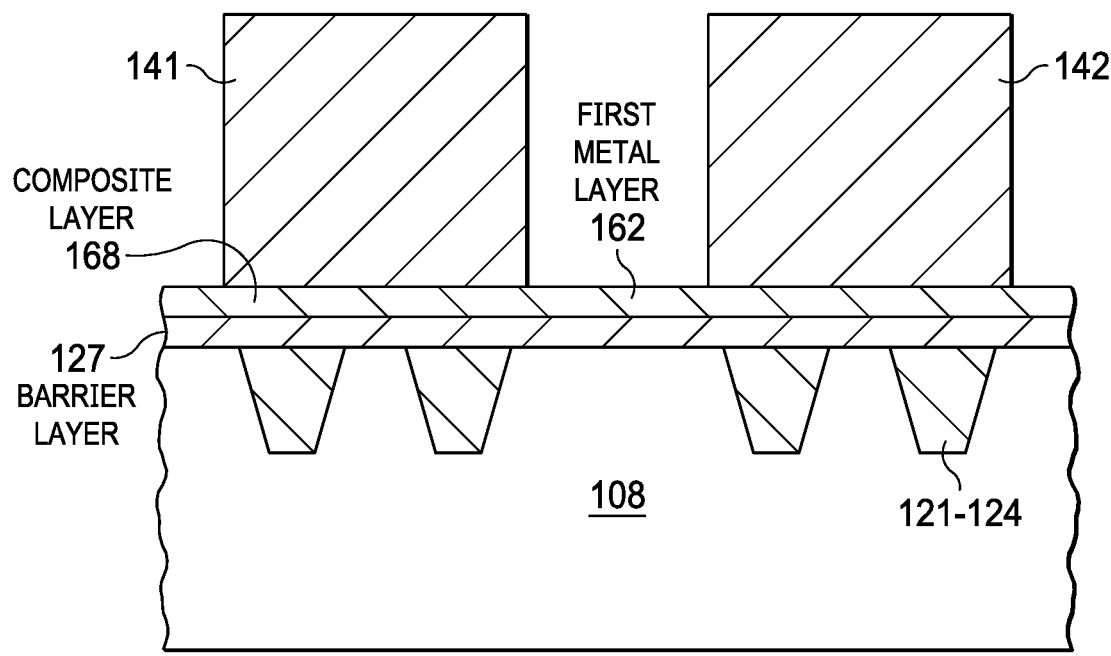

Step 204 comprises forming a patterned layer features shown as PR features 163 in FIGS. 3C and 3D having pattern openings over the through-via, such as using a PR layer. Step 205 comprises forming (e.g., plating) a second metal layer 164 (e.g., Ni, Co, Fe, Cr) on the first metal layer. Step 206 comprises forming (e.g., plating) a Cu comprising layer on the second metal layer to form a plurality of Cu traces within the pattern openings. Step 207 comprises removing the patterned layer features. Step 208 comprises heat treating to cause inter-diffusion to form a Cu-first metal-second metal composite layer under the Cu traces. Step 209 comprises etching lateral to the metal traces to remove the first metal layer and the refractory metal barrier layer. The composite layer is resistant to this etching.

FIGS. 3A-F show cross section depictions of an in-process IC with top-level vias including a first metal-second metal-Cu composite layer 168 on a barrier layer 127 so that the composite layer is at the interface between Cu traces 141, 142 and the barrier layer 127 over the top level vias 124 corresponding to steps in method 200 in FIG. 2 described above. Zn may be used as the first metal layer 162 and TiW may be used as the barrier layer 127 and as an adhesion promoter layer. An incoming silicon wafer with a metal stack thereon including through-vias shown in FIG. 3A as 121-124 (124 is the top level vias) which can correspond to the vias through the ILDs in FIG. 1 can be coated with a refractory metal barrier layer 127, such as 2,000 A to 4,000 A of sputtered TiW. This is followed by sputtering of a first metal layer 162 including Zn that functions as a seed layer for plating the Cu that can consist of a Zn layer 0.8 to 1.2 μm thick, with the result shown in FIG. 3B. The wafer can then be patterned with a patterning layer having patterned layer features shown by example as PR features 163 as shown in FIG. 3C to create openings over the top level vias 124 of the through-vias between the PR features 163 where later in the method top metal Cu comprising traces will be formed.

The openings between the PR features 163 can then be electroplated with a second metal layer 164 that is relatively thin (e.g., about 0.5 to 2.0 µm thick) such as comprising Ni or Co, formed using a chloride-free plating bath having a neutral or near-neutral pH defined herein as a pH of 6 to 7.5 to avoid removing the first metal layer 162 that comprises Zn, followed by electroplating a top metal Cu comprising layer including Cu traces 141, 142 from an acid Cu plating bath with the result shown in FIG. 3D.

The Cu traces 141, 142 are shown over 2 through-vias 121-124 that are lateral to one another. However, there can be one or 3 or more through-vias under each Cu trace 141, 142. A maximum overlap of the Cu traces 141, 142 over their through vias 121-124 is generally <2 µm, which can approach an overlap of zero, that is enabled by the reduced or eliminated undercut since the composite layer 168 is resistant against commonly used chemicals for the etching of the first metal layer 162 comprising Zn that functions as a seed layer for the Cu traces. The wafer is then annealed, such as at a temperature of 175 to 300° C. for a time 30 to 120 minutes, in air or a non-oxidizing ambient, such as in a furnace, in order to inter-diffuse the Cu from the bottom of the Cu traces, the first metal layer 162 comprising Zn, and the second metal layer 164, to form a first metal-second metal-Cu composite layer shown as a composite layer 168 that is at the interface between the Cu traces 141, 142 and the barrier layer 127 over the top level vias 124 as shown as 121-124 in FIG. 3E.

Figure 3F:
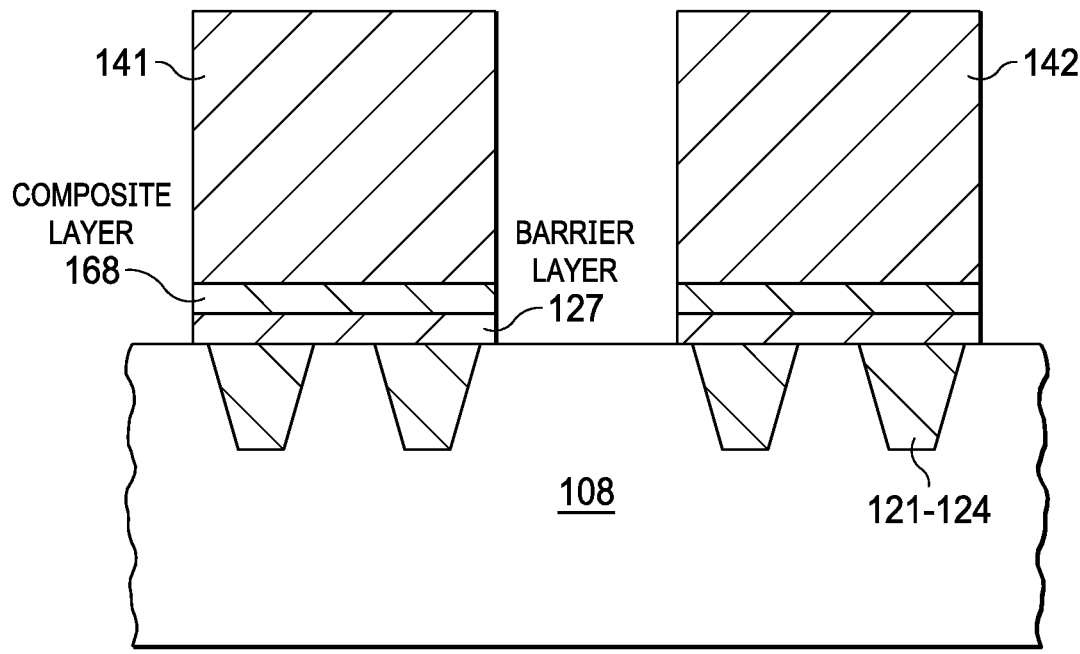

The composite layer 168 is generally 100 nm to 3 µm thick. The composite layer 168 across its thickness generally averages at least 30 wt. % Cu, 10% wt. % the second metal (e.g., Ni), and the balance of the composite layer being at least 40 wt. % Zn. The wt. % of the Zn, the second metal layer and the Cu traces in the composite layer 168 generally depends on the heat treatment used to inter-diffuse including the temperature and temperature ramp rate, the duration, as well as thickness of the first metal layer including Zn, the second metal layer, and the Cu traces, where the thickness of the composite layer 168 generally increases as the respective layers increase in thickness until saturation for the respective metal results. The first metal layer 162 between the Cu traces 141, 142 can then be etched away followed by etching of the barrier layer 127 with the resulting structure shown in FIG. 3F. Since the composite layer 168 is resistant against commonly used chemicals for the etching of the first metal layer 162, there is no detectable undercut of the composite layer 168 under the Cu traces 141, 142 as shown in FIG. 3F.

Subsequent processing can comprise forming at least dielectric layer (e.g., ILD 4 shown in FIG. 1) between the Cu traces 141, 142, then forming at least one passivation layer shown as 146, 147 in FIG. 1. A passivation layer etch then follows to expose the Cu bond pads of the top Cu layer.

EXAMPLES

Disclosed aspects are further illustrated by the following specific Examples, which should not be construed as limiting the scope or content of this Disclosure in any way.

200 mm Si wafers were sputtered with a 3,000 Å thick layer of TiW as the barrier layer 127 followed by sputtering a 1 µm Zn layer as the first metal layer 162. The wafers were then spin coated with 17 µm of PR followed by patterning to form PR features 163. A thin layer of nickel as the second metal layer 164 was then electroplated from a chloride-free neutral pH (a pH of about 7) nickel plating bath on the top of the first metal layer 162 as a Zn layer followed by Cu plating to form the Cu traces 141, 142, then a heat treatment at 250° C. for 1 hour to inter-diffuse together the Cu, Ni and Zn resulting in formation of composite layer 168 comprising Ni—Zn—Cu at the interface between the Cu traces 141, 142 and the barrier layer 127. The Ni—Zn—Cu composite layer had 30 to 40 wt. % Cu, 10 to 15 wt. % Ni, and the balance comprising Zn. The thickness of the composite layer was 600 nm to 1 µm. The composite layer 168 here being Ni—Zn—Cu is resistant against commonly used chemicals for etching of the first metal layer 162 comprising Zn that functions as a seed layer for Cu plating resulting in elimination of the undercut problem when using a conventional Cu seed layer and as a result reducing or eliminating the overlap of the Cu traces over the through-vias.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other aspects are possible within the scope of the claimed invention, and further additions, deletions, substitutions and modifications may be made to the described aspects without departing from the scope of this Disclosure.

The invention claimed is:

1. A method of fabricating an integrated circuit (IC), comprising:
   providing a substrate with a semiconductor surface layer including circuitry configured for realizing at least one circuit function comprising a plurality of transistors including at least one dielectric layer having through-vias over the plurality of transistors;
   depositing a barrier layer on the dielectric layer;
   forming a first metal layer comprising zinc on the barrier layer;
   forming a patterned layer including patterned layer features with pattern openings between the features over the through-vias;
   forming a second metal layer on the first metal layer;
   forming a copper (Cu) comprising layer on the second metal layer to form a plurality of Cu traces within the pattern openings;
   removing the patterned layer;
   heat treating to cause inter-diffusion to form a Cu-first metal-second metal composite layer under the Cu traces, and
   etching lateral to the metal traces to remove the first metal layer and the barrier layer.

2. The method of claim 1, wherein the first metal layer consists of zinc and wherein the second metal layer comprises nickel.

3. The method of claim 1, wherein the forming of the second metal layer comprises electroplating using a chloride-free plating bath having a pH of 6 to 7.5.

4. The method of claim 1, wherein the heat treating consumes all of the first metal layer into the composite layer.

5. The method of claim 1, wherein the patterned layer comprises a photoresist layer.

6. The method of claim 1, wherein the forming the second metal layer comprises electroplating, and wherein a thickness of the second metal layer as-formed is 500 Å to 2,000 Å.

7. The method of claim 1, wherein the heat treating comprises a temperature of 175 to 300° C. for a time of 30 to 120 minutes.

8. The method of claim 1, wherein the plurality of Cu traces are each over a plurality of the through-vias.

9. The method of claim 1, wherein the composite layer across its thickness averages at least 30 wt % Cu and at least 40 wt % zinc, and wherein the thickness of the composite layer is 100 nm to 3 μm.

10. An integrated circuit (IC), comprising:
a substrate with a semiconductor surface layer including circuitry configured for realizing at least one circuit function comprising a plurality of transistors, including at least one dielectric layer having a first and a second through-via over the plurality of transistors, the through-vias including a first top level via and at least a second top level via lateral to the first top level via;
a composite layer including copper (Cu), a first metal including zinc, and a second metal, wherein the composite layer is on a barrier layer that is on the first top level via and on the second top level via; and
a plurality of Cu traces including a first Cu top metal trace on the composite layer contacting the first top level via and a second Cu top metal trace on the composite layer contacting the second top level via.

11. The IC of claim 10, wherein the at least one dielectric layer comprises a metal stack on the semiconductor surface including a plurality of dielectric layers including the through-vias connecting through the plurality of dielectric layers in the metal stack.

12. The IC of claim 10, wherein the plurality of Cu traces are each over a plurality of the through-vias.

13. The IC of claim 10, wherein the composite layer is 100 nm to 3 μm thick.

14. The IC of claim 10, wherein the composite layer is in direct contact at its bottom with the barrier layer and at its top with the first and second Cu traces.

15. The IC of claim 10, wherein the second metal comprises nickel.

16. The IC of claim 15, wherein the composite layer is in direct contact at its bottom with the barrier layer and at its top with the first and second Cu traces.

17. An integrated circuit (IC), comprising:
a substrate with a semiconductor surface layer including circuitry configured for realizing at least one circuit function comprising a plurality of transistors, including at least one dielectric layer having a first and a second through-via over the plurality of transistors, the through-vias including a first top level via and at least a second top level via lateral to the first top level via;
a composite layer including copper (Cu), a first metal including zinc, and a second metal comprising nickel, iron or cobalt, wherein the composite layer is on a barrier layer that is on the first top level via and on the second top level via; and
a plurality of Cu traces including a first Cu top metal trace on the composite layer contacting the first top level via and a second Cu top metal trace on the composite layer contacting the second top level via.

18. The IC of claim 17, wherein the second metal comprises the nickel.

19. An integrated circuit (IC), comprising:
a substrate with a semiconductor surface layer including circuitry configured for realizing at least one circuit function comprising a plurality of transistors, including at least one dielectric layer having a first and a second through-via over the plurality of transistors, the through-vias including a first top level via and at least a second top level via lateral to the first top level via;
a composite layer including copper (Cu), a first metal including zinc, and a second metal, wherein the composite layer is on a barrier layer that is on the first top level via and on the second top level via; and
a plurality of Cu traces including a first Cu top metal trace on the composite layer contacting the first top level via and a second Cu top metal trace on the composite layer contacting the second top level via, wherein a maximum overlap of the first Cu trace on the first top level via and a second Cu trace on the second top level via are both <2 μm.

20. An integrated circuit (IC), comprising:
a substrate with a semiconductor surface layer including circuitry configured for realizing at least one circuit function comprising a plurality of transistors, including at least one dielectric layer having a first and a second through-via over the plurality of transistors, the through-vias including a first top level via and at least a second top level via lateral to the first top level via;
a composite layer including copper (Cu), a first metal including zinc, and a second metal, wherein the composite layer across its thickness averages at least 30 wt % Cu and at least 40 wt % zinc, and wherein the thickness of the composite layer is 100 nm to 3 μm, and wherein the composite layer is on a barrier layer that is on the first top level via and on the second top level via; and
a plurality of Cu traces including a first Cu top metal trace on the composite layer contacting the first top level via and a second Cu top metal trace on the composite layer contacting the second top level via.

* * * * *